(12) United States Patent
Kovsh et al.

(10) Patent No.: US 7,835,408 B2
(45) Date of Patent: Nov. 16, 2010

(54) OPTICAL TRANSMISSION SYSTEM

(75) Inventors: Alexey Kovsh, Dortmund (DE); Alexey Gubenko, Dortmund (DE); Igor Krestnikov, Dortmund (DE); Daniil Livshits, Dortmund (DE); Sergey Mikhrin, Dortmund (DE)

(73) Assignee: Innolume GmbH, Dortmund (DE)

( * ) Notice: Subject to any disclaimer, the term of this patent is extended or adjusted under 35 U.S.C. 154(b) by 566 days.

(21) Appl. No.: 11/938,472

(22) Filed: Nov. 12, 2007

(65) Prior Publication Data

US 2008/0180674 A1      Jul. 31, 2008

Related U.S. Application Data

(63) Continuation-in-part of application No. 11/737,946, filed on Apr. 20, 2007, now Pat. No. 7,555,027, and a continuation-in-part of application No. 11/295,943, filed on Dec. 7, 2005, now Pat. No. 7,561,607.

(60) Provisional application No. 60/867,952, filed on Nov. 30, 2006, provisional application No. 60/863,443, filed on Oct. 30, 2006, provisional application No. 60/745,641, filed on Apr. 26, 2006.

(51) Int. Cl.
*H01S 3/10* (2006.01)

(52) U.S. Cl. .............. 372/23; 372/26; 372/29.021; 372/39; 372/50.121

(58) Field of Classification Search ............... 372/23, 372/26, 29.021, 39
See application file for complete search history.

(56) References Cited

U.S. PATENT DOCUMENTS

| | | | |
|---|---|---|---|
| 4,100,562 A | 7/1978 | Sugawara et al. | |
| 4,368,481 A | 1/1983 | Ohashi et al. | |
| 4,438,447 A | 3/1984 | Copeland, III et al. | |
| 4,625,305 A | 11/1986 | Epworth | |
| 4,720,468 A | 1/1988 | Menigaux et al. | |
| 4,734,910 A | 3/1988 | Izadpanah | |
| 4,759,023 A | 7/1988 | Yamaguchi | |
| 4,839,884 A | 6/1989 | Schloss | |
| 4,918,497 A | 4/1990 | Edmond | |
| 4,959,540 A | 9/1990 | Fan et al. | |
| 4,980,568 A | 12/1990 | Merrick et al. | |

(Continued)

FOREIGN PATENT DOCUMENTS

EP          1341333          9/2003

OTHER PUBLICATIONS

L. F. Lester et al., "Optical Characteristics of 1.24-1Jm InAs Quantum-Dot Laser Diodes," IEEE Photonic Tech. Let, vol. 11, No. 8, pp. 931-933, 1999.*

(Continued)

*Primary Examiner*—Dung T Nguyen
(74) *Attorney, Agent, or Firm*—Brown & Michaels, PC

(57) ABSTRACT

An optical transmission system includes a laser, a transmitter and a receiver. The laser is capable of operating on an inhomogeneously broadened optical transition of the active region of the laser. A spectral bandwidth of an output lasing spectrum of the laser is greater than 5 nm and a spectral power density of the laser is greater than 2 mW/nm such that an optical power of the laser is greater than 10 mW. The laser provides a plurality of optical signals at different wavelengths. The transmitter is capable of providing modulation to each lasing wavelength independently and the receiver is capable of providing detection to each lasing wavelength independently.

11 Claims, 5 Drawing Sheets

U.S. PATENT DOCUMENTS

| | | | |
|---|---|---|---|
| 4,989,201 A | 1/1991 | Glance | |
| 5,153,933 A | 10/1992 | Smith et al. | |
| 5,190,883 A | 3/1993 | Menigaux et al. | |
| 5,193,131 A | 3/1993 | Bruno | |
| 5,208,822 A | 5/1993 | Haus et al. | |
| 5,214,664 A | 5/1993 | Paoli | |
| 5,265,112 A | 11/1993 | Noll et al. | |
| 5,274,649 A | 12/1993 | Hirayama et al. | |
| 5,291,010 A | 3/1994 | Tsuji | |
| 5,298,787 A | 3/1994 | Bozler et al. | |
| 5,321,786 A | 6/1994 | Valette et al. | |
| 5,345,557 A | 9/1994 | Wendt | |
| 5,357,122 A | 10/1994 | Okubora et al. | |
| 5,382,810 A | 1/1995 | Isaksson | |
| 5,463,229 A | 10/1995 | Takase et al. | |
| 5,523,557 A | 6/1996 | Bruno | |
| 5,536,974 A | 7/1996 | Nishiguchi | |
| 5,539,763 A | 7/1996 | Takemi et al. | |
| 5,548,433 A | 8/1996 | Smith | |
| 5,568,499 A | 10/1996 | Lear | |
| 5,569,934 A | 10/1996 | Fujii et al. | |
| 5,604,361 A | 2/1997 | Isaksson | |
| 5,608,231 A | 3/1997 | Ugajin et al. | |
| 5,633,527 A | 5/1997 | Lear | |
| 5,663,592 A | 9/1997 | Miyazawa et al. | |
| 5,673,284 A | 9/1997 | Congdon et al. | |
| 5,699,378 A | 12/1997 | Lealman et al. | |
| 5,705,831 A | 1/1998 | Uemura et al. | |
| 5,710,436 A | 1/1998 | Tanamoto et al. | |
| 5,728,605 A | 3/1998 | Mizutani | |
| 5,767,508 A | 6/1998 | Masui et al. | |
| 5,801,872 A | 9/1998 | Tsuji | |
| 5,802,084 A | 9/1998 | Bowers et al. | |
| 5,812,574 A | 9/1998 | Takeuchi et al. | |
| 5,812,708 A | 9/1998 | Rao | |
| 5,825,051 A | 10/1998 | Bauer et al. | |
| 5,828,679 A | 10/1998 | Fisher | |
| 5,854,804 A | 12/1998 | Winer et al. | |
| 5,889,903 A | 3/1999 | Rao | |
| 5,940,424 A | 8/1999 | Dietrich et al. | |
| 5,945,720 A | 8/1999 | Itatani et al. | |
| 5,946,438 A | 8/1999 | Minot et al. | |
| 6,011,296 A | 1/2000 | Hassard et al. | |
| 6,031,243 A | 2/2000 | Taylor | |
| 6,031,859 A | 2/2000 | Nambu | |
| 6,043,515 A | 3/2000 | Kamiguchi et al. | |
| 6,052,400 A | 4/2000 | Nanbu et al. | |
| 6,066,860 A | 5/2000 | Katayama et al. | |
| 6,093,939 A | 7/2000 | Artigue et al. | |
| 6,163,553 A | 12/2000 | Pfeiffer | |
| 6,201,638 B1 | 3/2001 | Hall et al. | |
| 6,232,142 B1 | 5/2001 | Yasukawa | |
| 6,245,259 B1 | 6/2001 | Hohn et al. | |
| 6,288,410 B1 | 9/2001 | Miyazawa | |
| 6,310,372 B1 | 10/2001 | Katayama et al. | |
| 6,318,901 B1 | 11/2001 | Heremans et al. | |
| 6,320,204 B1 | 11/2001 | Hirabayashi et al. | |
| 6,346,717 B1 | 2/2002 | Kawata | |
| 6,392,342 B1 | 5/2002 | Parikka | |
| 6,393,183 B1 | 5/2002 | Worley | |
| 6,403,395 B2 | 6/2002 | Hirabayashi et al. | |
| 6,407,438 B1 | 6/2002 | Severn | |
| 6,528,779 B1 | 3/2003 | Franz et al. | |
| 6,542,522 B1 | 4/2003 | Arahira | |
| 6,600,169 B2 | 7/2003 | Stintz et al. | |
| 6,611,007 B2 | 8/2003 | Thompson et al. | |
| 6,625,337 B2 | 9/2003 | Akiyama | |
| 6,628,686 B1 | 9/2003 | Sargent | |
| 6,628,691 B2 | 9/2003 | Hatori | |
| 6,645,829 B2 | 11/2003 | Fitzergald | |
| 6,661,816 B2 | 12/2003 | Delfyett et al. | |
| 6,677,655 B2 | 1/2004 | Fitzergald | |
| 6,680,495 B2 | 1/2004 | Fitzergald | |
| 6,701,049 B1 | 3/2004 | Awad et al. | |
| 6,768,754 B1 | 7/2004 | Fafard | |
| 6,782,021 B2 | 8/2004 | Huang et al. | |
| 6,813,423 B2 | 11/2004 | Goto et al. | |
| 6,816,525 B2 | 11/2004 | Stintz et al. | |
| 6,826,205 B1 | 11/2004 | Myers et al. | |
| 6,862,312 B2 | 3/2005 | Fafard | |
| 6,870,178 B2 | 3/2005 | Asryan et al. | |
| 6,996,138 B2 | 2/2006 | Jung et al. | |
| 7,106,974 B2 | 9/2006 | Lee et al. | |
| 7,123,633 B2 | 10/2006 | Shin et al. | |
| 2002/0030185 A1 | 3/2002 | Thompson et al. | |
| 2002/0085605 A1* | 7/2002 | Hatori | 372/50 |
| 2003/0015720 A1 | 1/2003 | Lian et al. | |
| 2003/0025118 A1 | 2/2003 | Yamazaki et al. | |
| 2003/0063647 A1 | 4/2003 | Yoshida et al. | |
| 2003/0128728 A1 | 7/2003 | Shimizu et al. | |
| 2003/0165173 A1 | 9/2003 | Helbing et al. | |
| 2004/0009681 A1 | 1/2004 | Fafard | |
| 2004/0057485 A1 | 3/2004 | Ohki et al. | |
| 2004/0065890 A1 | 4/2004 | Alphonse et al. | |
| 2004/0109633 A1 | 6/2004 | Pittman et al. | |
| 2004/0228564 A1 | 11/2004 | Gunn et al. | |
| 2005/0008048 A1 | 1/2005 | McInerney et al. | |
| 2005/0047727 A1 | 3/2005 | Shin et al. | |
| 2005/0175044 A1 | 8/2005 | Zakhleniuk et al. | |
| 2006/0227825 A1 | 10/2006 | Kovsh et al. | |
| 2008/0151950 A1 | 6/2008 | Lin et al. | |
| 2008/0198444 A1 | 8/2008 | Otsubo et al. | |

OTHER PUBLICATIONS

A.R. Kovsh, et al., "3.5 W CW Operation of quantum dot laser," Electron. Lett. vol. 35, N. 14 Jul. 1999, pp. 1161-1163.

A.E. Zhukov, et al., "Control of the emission wavelength of self-organized quantum dots: main achievements and present status," Semicond. Sci. Technol. vol. 14, N.6, Apr. 1999, pp. 575-581.

G. Park, et al., "Low-threshold oxide-confined 1.3-um quantum-dot laser," IEEE photon technol. Lett. vol. 13, N. 3, Mar. 2000, pp. 230-232.

X. Huang, et al., "Passive mode-locking in 1.3 um two-section InAs quantum dot lasers," Appl. Phys. Lett. vol. 78, N. 19, May 2001, pp. 2825-2827.

M.G. Thompson, et al., "10 GHz hybrid modelocking of monolithic InGaAs quantum dot lasers," IEE Electron. Lett. vol. 39, N. 15, Jul. 2003, pp. 1121-1122.

M. Kuntz, et al., "35 GHz mode-locking of 1.3 mm quantum dot lasers," Appl. Phys. Lett. vol. 85, N. 5, Aug. 2004, pp. 843-845.

A.E. Avrutin et al., "Monolithic and Multi-GigaHertz mode-locked semiconductors lasers; Constructions, experiments, models and applications," IEE Proc. Optoelectron. vol. 147, N. 4, Aug. 2000, pp. 251-278.

K.A. Williams et al., "Long wavelength monolithic mode-locked diode lasers," New Journal of Physics, vol. 6, N. 179, Nov. 2004, pp. 1-30.

M.G. Thompson, et al. "Transform-limited optical pulses from 18 GHz monolithic modelocked quantum dot lasers operating at 1.3 um," IEE Electron. Lett. vol. 40, N. 5, Mar. 2004, pp. 346-347.

Jinno, "Correlated and uncorrelated timing jitter in gain-switched laser diodes," IEEE Phot. Tech. Lett., vol. 5, pp. 1140-1143 (1993).

Leonard et al., "Direct formation of quantum-sized dots from uniform coherent islands in InGaAs on GaAs surfaces," Appl. Phys. Lett., vol. 63, pp. 3203-3205 (1993).

Lester et al., "Optical Characteristics of 1.24-um InAs Quantum-Dot Laser Diodes," IEEE Phot. Tech. Lett., vol. 11, pp. 931-933 (1999).

Liu et al., "Gain-Switched picosecond pulse (<10ps) generation from 1.3 um InGaAsP Laser Diodes," IEEE Quan. Elec., vol. 25, pp. 1417-1425 (1989).

Madhukar et al., "Nature of strained InAs three-dimensional island formation and distribution on GaAs(100)," Appl. Phys. Lett., vol. 64, pp. 2727-2729 (1994).

Moison et al., "Self-organized growth of regular nanometer-scale InAs dots on GaAs," Appl. Phys. Lett., vol. 64. pp. 196-198 (1994).

Reithmaier et al., "Single-mode distributed feedback and microlasers based on quantum-dot gain material," IEEE Selec. Top. In Quan. Elec., vol. 8, pp. 1035-1044 (2002).

Shoji et al., "Lasing Characteristics of self-formed quantum-dot lasers with Multi-stacked dot layer," IEEE Selec. Top. In Quan. Elec., vol. 3, pp. 188-195 (1997).

Sogawa et al., "Picosecond lasing dynamics of gain-switched quantum well lasers and its dependence on quantum well structures," IEEE Quan. Elec., vol. 27, pp. 1648-1654 (1991).

Fan, H.; Wu, C.; Dutta, N. K.; Koren, U.; Piccirilli, A.B.; "Colliding pulse mode locked laser", (Lasers and Electro-Optics Society 1999 12th Annual Meeting. LEOS '99), IEEE vol. 2, Nov. 8-11, 1999, pp. 701-702.

Haring, R; Paschotta, R; Aschwanden, A; Gini, E; Morier-Genoud, F; Keller, U;"High-Power Passively Mode-Locked Semiconductor Lasers", IEEE J of Quantum Electronics, vol. 38(9), Sep. 2002, pp. 1268-1275.

Tamura, K. R.; Komukai, T.; Morioka, T.; "Modulation Requirements and Transmission Characteristics of Electrically Tunable Mode Locked Lasers with Fiber Bragg Gratings", IEEE Photonics Technology Letters, vol. 14(6), Jun. 2002, pp. 834-836.

Yokoyama, H.; Hashimoto, Y.; Kurita, H.; Ogura, I.; Shimizu, T.; Kuribayashi, R.; Shirane, M.; Yamada, H.; "Highly reliable mode-locked semiconductor lasers and their applications" The 4th Pacific Rim Conference on Lasers and Electro-Optics, 2001. CLEO/Pacific Rim 2001. vol. 2, pp. II-498-II-499.

H. Benisty, C. M. Sotomayor-Torres, and C. Weisbuch, "Intrinsic mechanism for the poor luminescence properties of quantum-box systems", Phys. Rev. B 44(19), Nov. 1991, pp. 10945-10948.

G. Park, D. L. Huffaker, Z. Zou, O. B. Shchekin, D. G. Deppe, "Temperature dependence of lasing characteristics for long-wavelength (1.3-um) GaAs-based quantum-dot lasers", IEEE Photon. Technol. Lett. 11(3), Mar. 1999, pp. 301-303.

M. Sugawara, K. Mukai, Y. Nakata, "Light emission spectra of columnar-shaped self-assembled InGaAs/GaAs quantum-dot lasers: Effect of homogeneous broadening of the optical gain on lasing characteristics", Appl. Phys. Lett. 74(11), Mar. 1999, pp. 1561-1563.

S. S. Mikhrin, A. E. Zhukov, A. R. Kovsh, N. A. Maleev, V. M. Ustinov, Yu. M. Shernyakov, I. N. Kayander, E. Yu. Kondrat'eva, D. A. Livshits, I. S. Tarasov, M. V. Maksimov, A. F. Tsatsul'nikov, N. N. Ledentsov, P. S. Kop'ev, D. Bimberg, Zh. I. Alferov, "A spatially single-mode laser for a range of 1.25-1.28μm on the basis of InAs quantum dots on a GaAs substrate", Semiconductors 34(1), 119-121 (2000).

M. Grundmann, F. Heinrichsdorf, N. N. Ledentsov, C. Ribbat, D. Bimberg, A. E. Zhukov, A. R. Kovsh, M. V. Maximov, Yu. M. Shernyakov, V. M. Ustinov, Zh.I.Alferov, "Progress in quantum dot lasers: 1100 nm, 1300 nm, and high power applications", Jpn. J. Appl. Phys. 39(Part 1, N.4B), Apr. 2000, pp. 2341-2343.

O. B. Shchekin and D. G. Deppe, "The role of p-type doping and the density of states on the modulation response of quantum dot lasers", Appl. Phys. Lett. 80(15), Apr. 2002, pp. 2758-2760.

A. Markus, J. X. Chen, C. Paranthoen, A. Fiore, C. Platz, O. Gauthier-Lafaye, "Simultaneous two-state lasing in quantum-dot lasers", Appl. Phys. Lett. 82(12), Mar. 2003, pp. 1818-1820.

A. E. Zhukov, A. R. Kovsh, D. A. Livshits, V. M. Ustinov Zh. I. Alferov, "Output power and its limitation in ridge-waveguide 1.3 μm wavelength quantum-dot lasers", Semicond. Sci. Technol. 18(8), Jul. 2003, pp. 774-781.

A. Markus; A. Fiore, "Modeling carrier dynamics in quantum-dot lasers", Phys. stat. sol. (a) 201 (2), Jan. 2004, pp. 338-344.

S. Fathpour, Z. Mi, P. Bhattacharya, A. R. Kovsh, S. S. Mikhrin, I. L. Krestnikov, A. V. Kozhukhov, and N. N. Ledentsov, "The role of Auger recombination in the temperature-dependent output characteristics (T0=∞) of p-doped 1.3 μm quantum dot lasers", Appl. Phys. Lett. 85(22), Nov. 2004, pp. 5164-5166.

Ch. Ribbat, R. Sellin, M. Grundmann, D. Bimberg; "High Power Quantum Dot Laser at 1160 nm"; Phys. Stat. So. (b) 224, No. 3, pp. 819-822 (2001).

A.E. Gubenko et al., "Mode-locking at 9.7 GHz repetition rate with 1.7 ps pulse duration in two-section QD lasers"; IEE 2004, pp. 51-52.

Avrutin, E.A.; "Dynamic Modal Analysis of Monolithic Mode-Locked Semiconductor Lasers"; IEEE J of Selected Topids in Quantium Electronics, VI 9. No. 3, May 2001, pp. 844-856.

Zhang, L. et al. "Low Timing Jitter, 5 GHz Optical Pulse Form Monolithic Two-section Passively Mode Locked 1250/1310 nm Quantum Dot Lasers for High Speed Optical Interconnects" Optical Society of America, 2004.

Bagley et al. "Broadband Operation of InGaAsP-InGaAs Grin-SC-MQW BH Amplifiers with 115mW Output Power." Electronics Letters, IEE Stevenage, GB, vol. 26, No. 8, Apr. 14, 1990.

International Search Report and Written Opinion dated Mar. 14, 2008 for PCT/EP2007/010313.

Chuang S. L., Physics of Optoelectronic Devices. New York: John Wiley & Sons, 1995.

Yasaka, H., et al. "Multiwavelength light source with precise frequency spacing using mode-locked semiconductor laser and arrayed waveguide grating filter", Conference on Optical Fiber Communication 1996 (OFC), San Jose, CA, USA, Feb. 1996.

Sanjoh, H., et al. "Multiwavelength Light Source with Precise Frequency Spacing Using a Mode-Locked Semiconductor Laser and an Arrayed Waveguide Grating Filter", IEEE Photon. Technol. Lett. 9(6), 818-820 (1997).

Shi, H. et al., "5 Gbit/s optical WDM transmitter using single-stripe multiwavelength modelocked semiconductor laser", Electron Lett. 34(2), 179-180 (1998).

Kim, H. D., et al. "A Low-Cost WDM Source with an ASE Injected Fabry—Perot Semiconductor Laser", IEEE Photon. Technol. Lett. 12(8), 1067-1069 (2000).

K. Sato and H. Toba, "Reduction of Mode Partition Noise by Using Semiconductor Optical Amplifiers", IEEE J. Selected Topics Quantum Electron. 7(2), 328-333 (2001).

Delfyett, P. J., et al. "Optical Frequency Combs From Semiconductor Lasers and Applications in Ultrawideband Signal Processing and Communications", J. Lightwave Technol. 24(7), 2701-2719 (2006).

Krakowski, M. "High power, very low noise, C. W. operation of 1.32 μm quantum-dot Fabry Perot laser diodes", International Semiconductor Laser Conference 2006 (ISLC), Kohala Coast, Hawaii, USA, Sep. 17-21, 2006.

P. Eliseev, Tunable Grating-Coupled Laser Oscillation and Spectral Hole Burning in an InAs Quantum-Dot Laser Diode, IEEE Journal of Quantum Electronics, Apr. 2000, pp. 479-485, vol. 36 No. 4.

Djie, H. S., Ooi, B. S., Fang, X.-M., Wu, Y., Fastenau, J. M., Liu, W. K., and Hopkinson, M., "Room-temperature broadband emission of an InGaAs/GaAs quantum dots laser", Optics Letters, 32, 44 (2007).

Kovsh, A., Krestnikov, I., Livshits, D., Mikhrin, S., Weimert, J., and Zhukov, A., "Quantum dot laser with 75nm broad spectrum of emission", Optics Letters, 32, 793 (2007).

Henry, C.H., Henry, P.S., and Lax, M., "Partition fluctuations in nearly single-longitudinal-mode lasers," J. Lightwave Technol., LT-2, 209 (1984).

Schimpe, R., "Theory of intensity noise in semiconductor laser emission", Z. Phys. B—Condensed Matter, 52, 289 (1983).

Agrawal, G. P., "Mode-partition noise and intensity correlation in a two-mode semiconductor laser", Phys. Rev. A, 37, 2488 (1988).

Nguyen, L. V. T., "Mode-partition noise in semiconductor lasers", Defense Science and Technology Organization (Australia) research report DSTO-RR-0244 (2002).

Su, H., and Lester, L. F, "Dynamic properties of quantum dot distributed feedback lasers: high speed, linewidth and chirp", J. Phys. D: Appl. Phys. 38, 2112 (2005).

Ghosh, S., Pradhan, S., and Bhattacharya, P., "Dynamic characteristics of high-speed In0.4Ga0.6As/GaAs self-organized quantum dot lasers at room temperature", Appl. Phys. Lett., 81, 3055 (2002).

Homar, M. et al. "Traveling Wave Model of a Multimode Fabry-perot laser in Free Running and External Cavity Configuration" IEEE Journal of Quantum Electronics vol. 32, No. 3, Mar. 1996.

Ohtsu, Motoichi et al. "Analysis of Mode partitioning and Mode Hopping is Semiconductor Lasers", IEEE Journal of Quantum Electronics, vol. 25, No. 1, Jan. 1989.

Yamada, Minoru et al. "Time-Dependent Measurement of the Mode-Competition Phenomena Among Longitudinal Modes in Long-Wavelength Lasers." IEEE Journal of Quantum Electronics vol. 39, No. 12 Dec. 2003.

Nagarajan, Radhakrishnan et al. "High Speed Quantum-Well lasers and Carrier Transport Effects" IEEE Journal of Quantum Electronics vol. 28, No. 10 Oct. 1992.

Fukushima, Toru et al. "Relative Intensity Noise reduction in InGaAs/InP Multiple Quantum Well Lasers with Low Nonlinear Damping" IEEE Photonic Technology Letters, vol. 3, No. 8 Aug. 1991.

Agrawal, Govind P. "Effect of Gain and Index Nonlinearities on Single-Mode Dynamics in Semiconductor Lasers" IEEE Journal of Quantum Electronics vol. 26, No. 11, Nov. 1990.

Sato, Kenji "Optical Pulse Generation Using Fabry-Perot Lasers Under Continuous-Wave Operation", IEEE Journal of Selected Topics in Quantum Electronics vol. 9, No. 5 Sep./Oct. 2003.

Ahmed, Moustafa et al. "Influence of Instantaneous Mode Competition on the Dynamics of Semiconductor Lasers", IEEE Journal of Quantum Electronics vol. 38, No. 6, Jun. 2002.

Henry, Charles H. "Theory of Spontaneous Emission Noise in Open Resonators and its Application to lasers and Optical Amplifiers" Journal of Lightwave technology, vol. LT-4, No. 3, Mar. 1986.

* cited by examiner

OPTICAL TRANSMISSION SYSTEM

REFERENCE TO RELATED APPLICATIONS

This application claims one or more inventions which were disclosed in Provisional Application No. 60/867,952, filed Nov. 30, 2006, entitled "OPTICAL TRANSMISSION SYSTEM". The benefit under 35 USC §119(e) of the United States provisional application is hereby claimed, and the aforementioned application is hereby incorporated herein by reference.

This application is also a continuation-in-part of co-pending patent application Ser. No. 11/295,943, filed Dec. 7, 2005, entitled "LASER SOURCE WITH BROADBAND SPECTRUM EMISSION" and co-pending patent application Ser. No. 11/737,946, filed Apr. 20, 2007, entitled "LASER SOURCE WITH BROADBAND SPECTRUM EMISSION", which claims one or more inventions which were disclosed in Provisional Application No. 60/745,641, filed Apr. 26, 2006, entitled "LASER SOURCE WITH BROADBAND SPECTRUM EMISSION" and Provisional Application No. 60/863,443, filed Oct. 30, 2006, entitled "LASER SOURCE WITH BROADBAND SPECTRUM EMISSION". The aforementioned applications are hereby incorporated herein by reference.

BACKGROUND OF THE INVENTION

1. Field of the Invention

The present invention relates to an optical transmission system and, more particularly, to an optical transmission system that uses a plurality of optical signals at different wavelengths.

2. Description of Related Art

The use of optical signals having different wavelengths results in greatly increased information carrying capacity. This technique is known as wavelength-division-multiplexing (WDM). This technique requires an optical source which is capable of providing a sufficiently large number of signals having different wavelengths (channels) and is also capable of providing a sufficiently high optical power per channel.

Modulating and detecting each channel independently is also required in order to carry information by means of an optical signal.

There is a need in the art for an optical transmission system based on a single laser instead of a plurality of lasers.

SUMMARY OF THE INVENTION

An optical transmission system includes a laser, a transmitter and a receiver. The laser is capable of operating on an inhomogeneously broadened optical transition of the active region of the laser. A spectral bandwidth of an output lasing spectrum of the laser is greater than 5 nm and a spectral power density of the laser is greater than 2 mW/nm such that an optical power of the laser is greater than 10 mW. The laser provides a plurality of optical signals at different wavelengths. The transmitter is capable of providing modulation to each lasing wavelength independently. The receiver is capable of providing detection to each lasing wavelength independently.

The laser may further include a bandpass filter in order to restrict the spectral range of emission to a desired number of optical channels.

In a preferred embodiment, the laser is a Fabry-Perot laser operating in a continuous-wave regime and the plurality of optical signals includes a plurality of longitudinal modes of the Fabry-Perot laser resonator. The relative intensity noise (RIN) for each of the longitudinal modes preferably does not exceed −120 dB/Hz at 0.1 GHz, −130 dB/Hz at 1.0 GHz and −140 dB/Hz at 10 GHz.

A laser based on an active region with an inhomogeneously broadened optical transition achieves a broad spectrum of the laser emission in combination with sufficiently high spectral power density. The temporal stability of spectral distribution of the emitted optical power may be very high and a relative intensity noise may be sufficiently low. This allows splitting an output spectrum into several independent optical channels and manipulating them separately for the use in a WDM system. In a preferred embodiment, the active region is an array of semiconductor quantum dots formed by self-organization phenomena in epitaxial growth.

BRIEF DESCRIPTION OF THE DRAWINGS

FIG. 3b shows in more detail part of the experimental emission spectrum of a semiconductor laser of FIG. 3a.

DETAILED DESCRIPTION OF THE INVENTION

Figure 1:
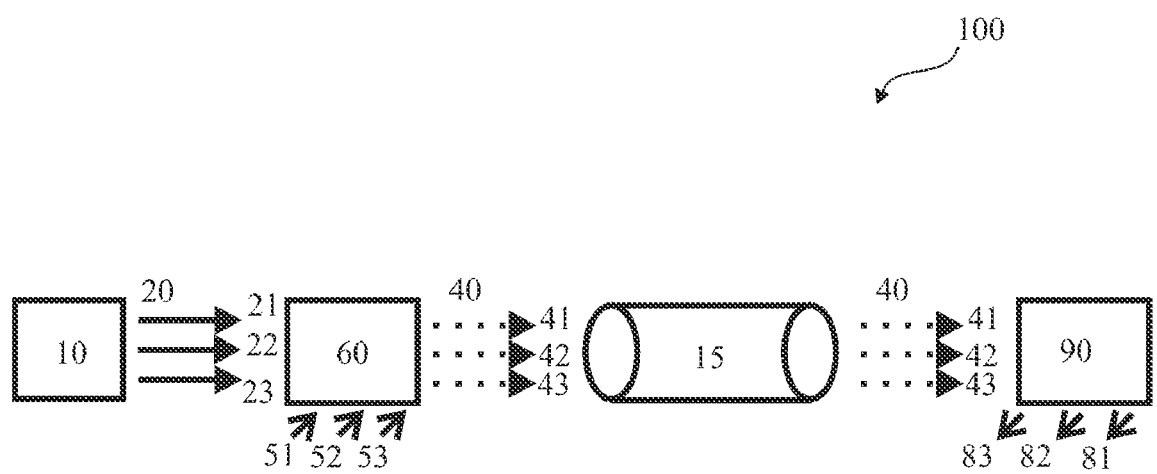
FIG. 1 schematically shows an optical transmission system according to a preferred embodiment of the present invention.

An optical source for an optical transmission system based on a single laser instead of a plurality of lasers would be economically beneficial. For example, U.S. patent application Ser. No. 11/737,946, filed Apr. 20, 2007, entitled "LASER SOURCE WITH BROADBAND SPECTRUM EMISSION", herein incorporated by reference, discloses a laser based on semiconductor quantum dots having a broadband spectrum of emission and a high output power.

A conventional laser, for example a semiconductor diode laser based on a quantum well, is sometimes capable of providing a relatively broad optical spectrum. This is termed multi-frequency laser operation, when the laser emits a number of longitudinal modes of the resonator. However, in a conventional laser, there are two limitations which prevent the use of such an output in a WDM system. First, the spectral bandwidth is typically only a few nanometers. Therefore, it is difficult to split such a spectrum into many channels. Second, temporal stability of a spectral distribution of the optical power is very low (i.e. RIN of a longitudinal mode is high). Therefore, a split optical channel is very noisy.

The first limitation comes from the fact that, in the active region of a conventional laser, there exists a fast rate of carrier capture and relaxation to the energy levels. As a result, an optical gain saturation is not very pronounced and a tendency to lase at several longitudinal modes is apparent to a lesser degree. The second limitation is due to a competition between different longitudinal modes for a common gain (mode partition noise) because the laser medium is homogeneously broadened.

These limitations can be eliminated if the laser is based on an active region with an increased time of energy relaxation and inhomogeneously broadened optical transition. It is possible to achieve a broad spectrum of the laser emission in combination with sufficiently high spectral power density. The temporal stability of spectral distribution of the emitted optical power can be very high, i.e. a relative intensity noise can be sufficiently low. This allows splitting an output spectrum into several independent optical channels and manipulating them separately for the use in a WDM system.

One example of such an active region is an array of semiconductor quantum dots formed by self-organization phenomena in epitaxial growth. In such an array, quantum dot electronic states of different energy within an inhomogeneously broadened ground-state level belong to spatially separated quantum dots having different sizes, shapes or other parameters which affect the quantum energy. Therefore, in a quantum dot laser, only a certain portion of the available quantum dots contributes to the lasing process, namely those quantum dots which have an optical transition energy approximately equal to the lasing transition. Other quantum dots act as a reservoir providing charge carriers to the lasing dots. However, such an interaction can be strongly suppressed because a charge carrier should be first excited from the first quantum dot to a matrix or a wetting layer, then travel across the active region to a second dot, and finally be captured by the second dot. As a result, a refilling process may be significantly slowed down in a quantum dot laser, and therefore, broadening of the laser emission spectrum by side modes can be significantly enhanced. U.S. patent application Ser. No. 11/737,946, filed Apr. 20, 2007, entitled "LASER SOURCE WITH BROADBAND SPECTRUM EMISSION", discloses a method for increasing the spectral bandwidth and the spectral power density from a quantum dot diode laser.

A high degree of temporal stability in such a laser system means that an optical power of each split optical channel remains stable for a long period of time which makes it possible to achieve low levels of noise and acceptable error bit rates. This improvement in temporal stability likely originates from being able to easily saturate the optical gain of an inhomogeneously broadened active region. When the laser operates in a regime of the saturated gain in a significant part of the spectrum, there is no possibility for different longitudinal modes to compete for a gain. Therefore, the optical gain in a significant part of the spectrum remains at its saturated level being stable in time. This results in high stability of intensities of emitted longitudinal modes. In one embodiment, this results in high stability of intensities of a multimode laser, for example a Fabry-Perot laser.

An optical transmission system 100 according to a preferred embodiment of the present invention is schematically shown in FIG. 1. The transmission system 100 includes a laser 10, a transmitter 60 and a receiver 90. The laser emits a plurality 20 of optical signals at different wavelengths. In FIG. 1, only three different wavelengths are illustrated by numerals 21, 22, 23. However, it is preferred that the laser emits more optical signals at different wavelengths. In a preferred embodiment, the laser may further include a bandpass filter, for example a distributed Bragg reflector, in order to restrict a number of emitting longitudinal modes to a desired number of optical channels.

It is preferred that the laser 10 operates in a continuous-wave (CW) mode such that the intensities of the optical signals 21, 22, 23 are nearly constant in time. The intensities of optical signals 21, 22, 23 at different wavelengths are also preferably nearly equal to each other.

The transmitter 60 may include waveguides, modulators, as well as lenses, prisms, arrayed waveguide gratings, and other standard optical components. The waveguides, modulators, and other optical components of the transmitter 60 are preferably embedded into a semiconductor chip. The semiconductor chip is preferably based on a material including, but not limited to, silicon, gallium arsenide, or indium phosphide.

The optical signals 20 enter the transmitter 60. The transmitter is capable of providing modulation to each lasing wavelength independently in response to a plurality of control signals 51, 52, 53. As a result, the transmitter 60 outputs a plurality 40 of the intensity modulated optical signals 41, 42, and 43 at different wavelengths. It is preferred that the number of modulated optical signals 41, 42, and 43 corresponds to a number of CW optical signals 21, 22, and 23, while their wavelengths remain unchanged.

The optical transmission system 100 may further include a transmission line 15 that is intended to guide the modulated optical signals 41, 42, and 43 at different wavelengths outputted from the transmitter 60 to the receiver 90. The transmission line 15 may include optical fibers, planar waveguides, mirrors, lenses and other standard optical components suitable for guiding the light.

The receiver 90 may include waveguides and detectors as well as lenses, prisms, arrayed waveguide gratings, and other standard optical components. The waveguides, detectors, and other optical components of the receiver 90 are preferably embedded into a semiconductor chip. The semiconductor chip is preferably based on a material including, but not limited to, silicon, gallium arsenide, or indium phosphide.

The plurality 40 of the intensity modulated optical signals enter the receiver 90. The receiver 90 is capable of providing detection to each lasing wavelength independently. As a result, the receiver 90 extracts as many information signals 81, 82, and 83 as different wavelengths are inputted.

Figure 2A:
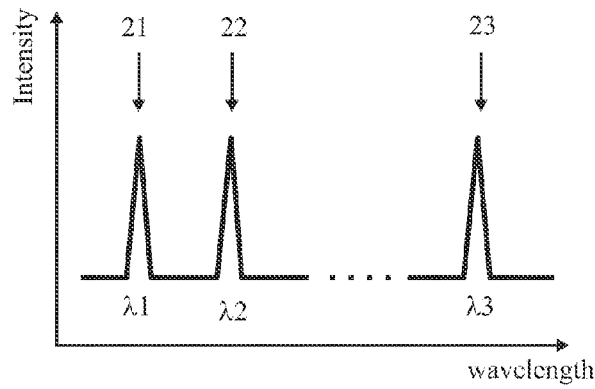
FIG. 2a schematically illustrates a spectrum of a plurality of CW (continuous wave) optical signals 21, 22, and 23.
Figure 2B:
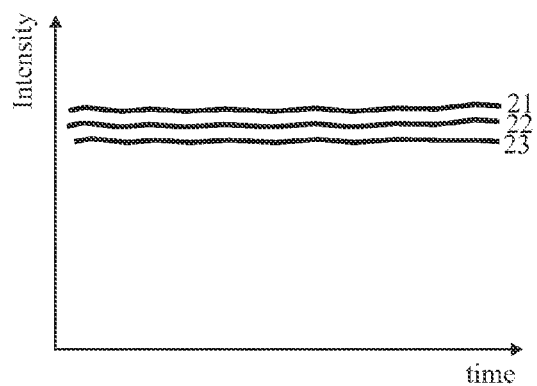
FIG. 2b shows the intensity of the CW optical signals 21, 22 and 23 in FIG. 2a over time.

FIGS. 2a and 2b schematically illustrate a spectrum of a plurality of CW optical signals 21, 22, and 23 and temporal variation of their intensity. The laser emits a plurality of optical signals at different wavelengths $\lambda 1$, $\lambda 2$ and $\lambda 3$. Each optical signal may represent a group of a few neighboring longitudinal modes. Preferably, each optical signal represents a single longitudinal mode.

FIG. 1, FIG. 2a and FIG. 2b illustrate only three different wavelengths. However, the laser preferably emits more optical signals at different wavelengths. Neighboring different wavelengths are preferably equally spaced. The intensities of the optical signals 21, 22, 23 are nearly constant in time and the intensities of the optical signals 21, 22, 23 are nearly equal to each other.

Figure 2C:
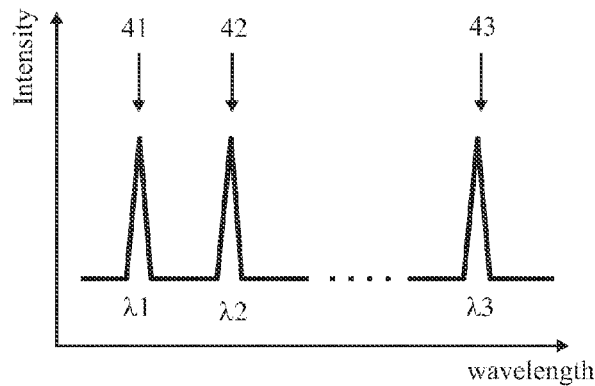
FIG. 2c schematically illustrates a spectrum of a plurality of intensity modulated optical signals 41, 42, and 43.
Figure 2D:
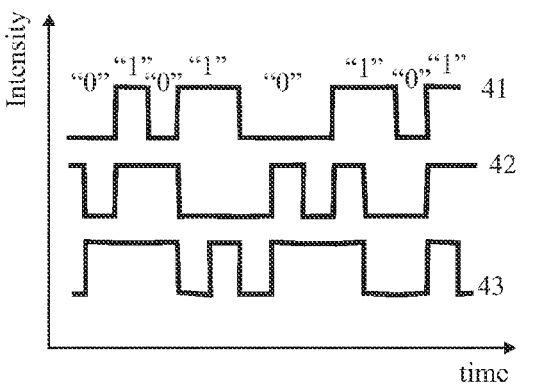
FIG. 2d shows the intensity of the intensity modulated optical signals 41, 42, and 43 over time.

FIGS. 2c and 2d schematically illustrate a spectrum of a plurality of intensity modulated optical signals 41, 42, and 43 and temporal variation of their intensity. The set of wavelengths $\lambda 1$, $\lambda 2$ and $\lambda 3$ remains unchanged while the intensities of the optical signals 41, 42, and 43 are modulated in time in accordance with carrying information.

FIG. 2d schematically shows that the intensity of an optical signal at certain wavelengths (e.g. of optical signal 41 at wavelength λ1) is encoded. There are different schemes of encoding. For example, the high intensity of signal 41 may correspond to level "1" of a binary sequence and the low intensity of signal 41 may correspond to level "0" of a binary sequence. Thus, it is possible to carry certain information as a sequence of "0" and "1" binary codes by changing the intensity of the optical signal 41. Because signal 42 at wavelength λ2 can be modulated independently, signal 42 (and other signals at other wavelengths) may carry another sequence of binary codes, thereby providing an additional information bearing channel.

The laser 10 is capable of operating on an inhomogeneously broadened ground-state optical transition of the active region of the laser. In a preferred embodiment, the laser 100 is a semiconductor diode laser. In one embodiment, the active region of the laser includes a plurality of semiconductor quantum dots embedded in a semiconductor matrix having fluctuations in a parameter affecting the optical transition energy, including, but not limited to, solely or in combination: size, shape, chemical composition, strain and matrix.

In another embodiment, the active region of the laser includes a plurality of two-dimensional quantum wells in a semiconductor matrix having fluctuations in a parameter affecting the optical transition energy, including, but not limited to, solely or in combination: thickness, chemical composition, compositional profile, strain and matrix.

In yet another embodiment, the laser is a fiber laser and the active region of the laser includes a plurality of ions embedded in a fiber core having fluctuations in a parameter affecting the optical transition energy, including, but not limited to, solely or in combination: chemical composition, degree of ionization and the distance between neighboring ions.

Other kinds of lasers may be used in the system 100, provided that the laser 10 is capable of operating on an inhomogeneously broadened ground-state optical transition of the active region of the laser. For example, the laser may optionally include active regions with any combination of quantum dots and quantum wells.

A spectral bandwidth of an output lasing spectrum of the laser 10 is preferably greater than 10 nm and a spectral power density of the laser 10 is preferably greater than 3 mW/nm such that an optical power of the laser 10 is preferably greater than 30 mW. One example of such a laser based on self-organized quantum dots is disclosed in U.S. patent application Ser. No. 11/737,946, filed Apr. 20, 2007, entitled "LASER SOURCE WITH BROADBAND SPECTRUM EMISSION".

In a preferred embodiment, the laser represents an edge-emitting Fabry-Perot laser in a pigtailed package. A pigtailed package is a standard laser package having an optical fiber for outputting the laser radiation. Different wavelengths λ1, λ2, and λ3 correspond to different longitudinal modes of the Fabry-Perot resonator of the laser. The laser 10 may further include a bandpass filter in order to restrict a number of emitting longitudinal modes to a desired number of optical channels. Thus, the laser 10 provides a plurality 20 of optical signals at different wavelengths.

EXAMPLES

Figure 3A:
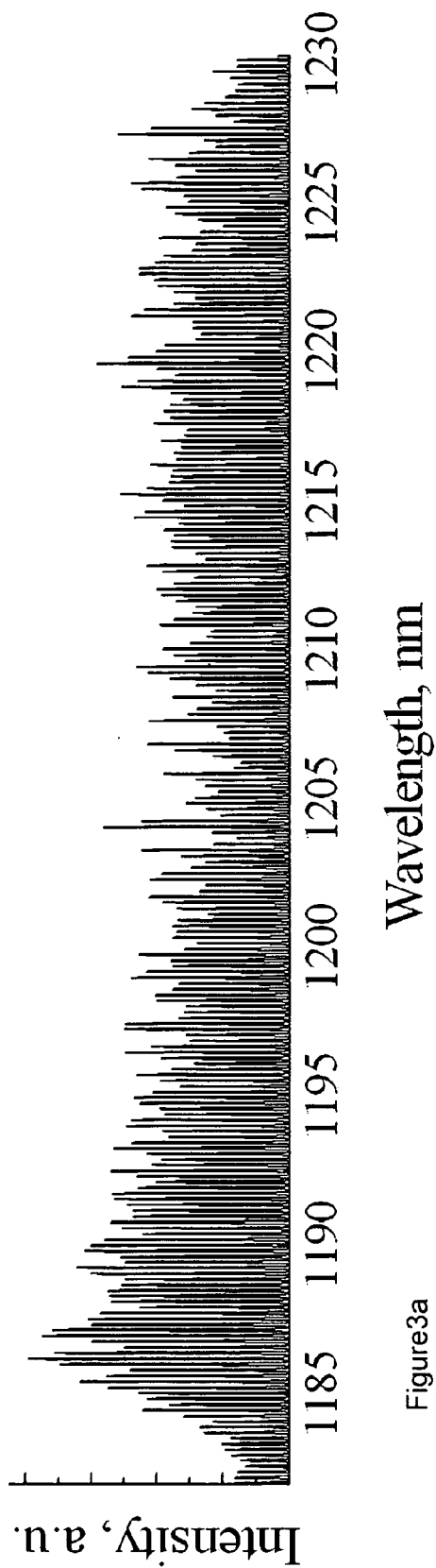
FIG. 3a shows an example of experimental emission spectrum of a semiconductor laser fabricated in accordance with an embodiment of the present invention.

FIG. 3a shows an example of an experimental emission spectrum of a semiconductor laser according to an embodiment of the present invention. The active region of the laser represents an array of self-organized InAs/InGaAs quantum dots with inhomogeneously broadened optical transitions due to fluctuation of the quantum dot size. The laser in this example operates in a CW regime at 25° C. with a total optical power of 300 mW at a pump current of 550 mA. The laser spectrum ranges from approximately 1184 nm to approximately 1228 nm so that the spectral bandwidth is approximately 44 nm and the average spectral power density is approximately 6.8 mW/nm.

Figure 3B:
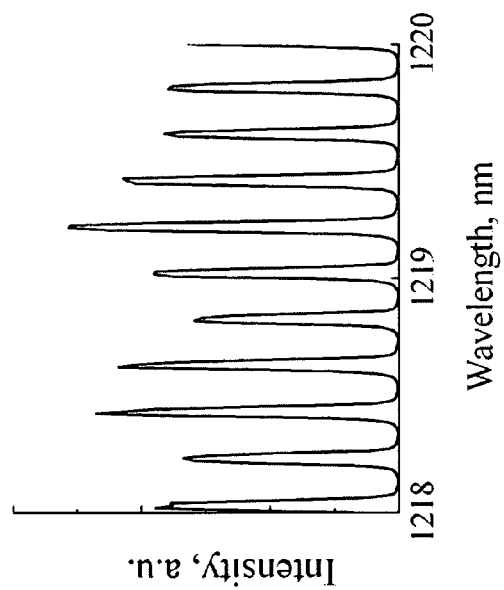

As shown in FIG. 3b, where the 1218-1220 nm interval of the spectrum is shown in more detail, the spectrum includes a number of longitudinal modes separated from each other by approximately 0.2 nm. Therefore, the laser spectrum may include as many as approximately 220 longitudinal modes. An average optical power of one longitudinal mode is therefore greater than 1.3 mW.

In another example, relative intensity noise spectra for several longitudinal modes of a broadband quantum-dot Fabry-Perot laser was measured to demonstrate high temporal stability of optical channels. The laser active region represents ten non-identical planes of self-organized quantum dots. Each quantum dot plane was formed by epitaxial deposition of 0.8 nm-thick InAs insertions covered with $In_{0.15}Ga_{0.85}As$ capping layers and embedded into a GaAs matrix. The epitaxial wafer was processed into 3-μm-wide ridge structures. The cavity length is approximately 1 mm as terminated by as-cleaved facets forming two laser mirrors. The laser was driven by a forward CW current of 85 mA, which is 5-times above the lasing threshold.

In this example, a separation between neighboring longitudinal modes (neighboring optical channels) is 0.22 nm. The laser emission bandwidth was restricted to 2 nm (from 1264 to 1266 nm) in order to include 10 longitudinal modes. The average spectral power density of the laser was ~25 mW/nm (total power is 50 mW), and an average optical power per one channel was more than 2 mW.

Figure 4A:
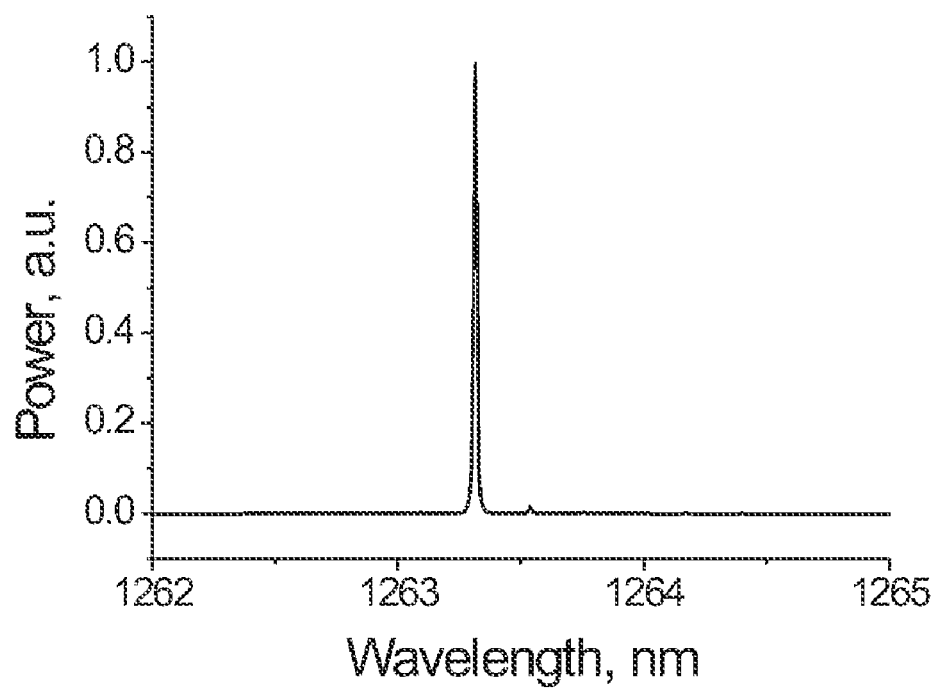
FIG. 4a shows an experimental spectrum of one spectrally filtered longitudinal mode (one optical channel) of a laser fabricated in accordance with a preferred embodiment of the present invention.
Figure 4B:
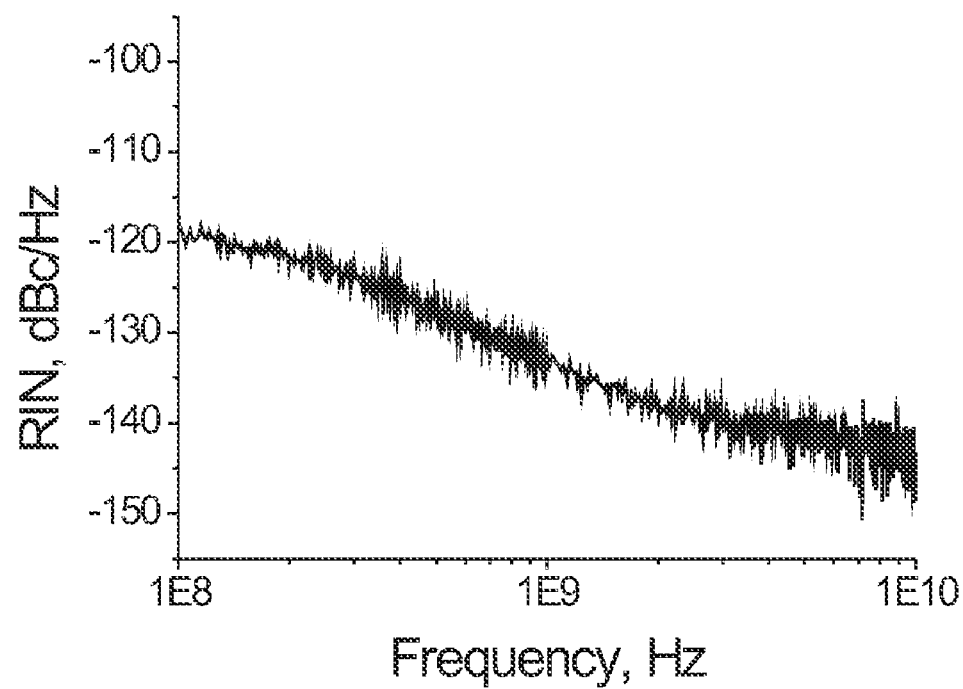
FIG. 4b shows a frequency spectrum of relative intensity noise for one optical channel of an optical source fabricated in accordance with a preferred embodiment of the present invention.

An individual line mode was filtered out using a fiber Fabry-Perot tunable filter. FIG. 4a shows a filtered intensity of one of the longitudinal modes. In this case, as well as for other filtered modes, side mode suppression ratio is ~20 dB. FIG. 4b shows frequency dependence of relative intensity noise for one optical channel. The relative intensity noise is −120 dB/Hz at 0.1 GHz, −133 dB/Hz at 1.0 GHz and −140 dB/Hz at 10 GHz. Such a very low level of the relative intensity noise for a single wavelength line makes it suitable for an independent optical channel of a multi-channel transmission system.

Bit error rate and an eye diagram were measured for ten spectrally filtered optical channels to show that the optical source of the present invention is compatible with a high-speed WDM application. The channel intensity was externally modulated at 10 Gb/s by a $2^{31}$-1 pseudorandom binary non-return-to-zero sequence using a pulse pattern generator and a lithium niobate digital modulator.

Figure 5A:
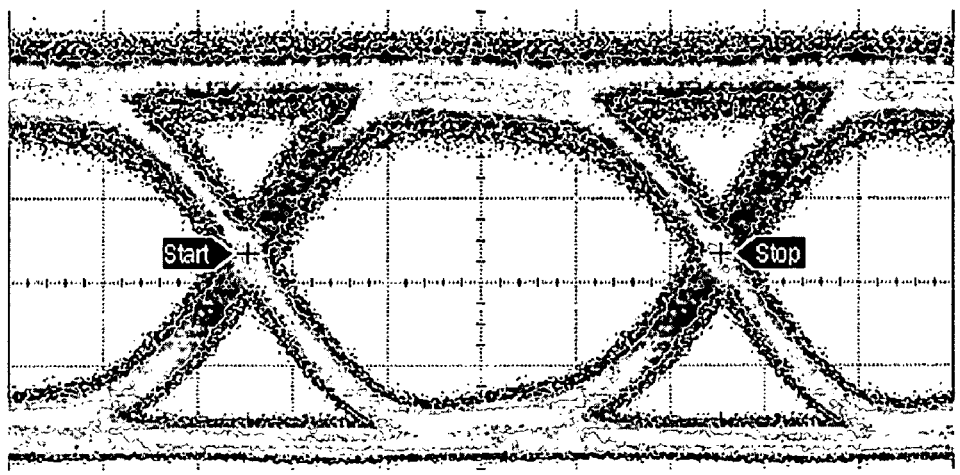
FIG. 5a shows an eye diagram generated by a 10 Gb/s digital modulation of one spectrally filtered longitudinal mode (one optical channel) of a laser fabricated in accordance with a preferred embodiment of the present invention.

FIG. 5a shows an eye diagram for the 1265.48 nm mode at −3 dBm received power. FIG. 5a shows an "open eye", i.e. no error points in the central region. An open eye pattern corresponds to minimal signal distortion.

Table 1 shows some of the data obtained from the eye diagram of FIG. 5a. The extinction ratio is defined as the ratio $P_1/P_0$, where $P_1$ is the optical power level generated when the light source is "on," and $P_0$ is the power level generated when the light source is "off." FIG. 5a corresponds to an extinction ratio of approximately 7 dB, which is sufficient for use in WDM applications. The column labeled "current" includes data from a particular reading. The column labeled "minimum" includes the minimum values obtained during the experiment and the column labeled "maximum" includes the maximum values obtained during the experiment.

TABLE 1

|         | Current  | Minimum  | Maximum  |
|---------|----------|----------|----------|
| Q factor | 10.30   | 9.71     | 10.30    |
| Ext. ratio | 7.18 dB | 7.17 dB | 7.18 dB |
| Bit Rate | 10.0 Gbps | 10.0 Gbps | 10.0 Gbps |

The Q-factor (also called the "signal-to-noise ratio") is defined as the signal difference between $P_1$ and $P_0$ levels divided by the sum of noise at both levels ($\sigma_1$ and $\sigma_0$):

$$Q = \frac{P_1 - P_0}{\sigma_1 + \sigma_0}.$$

The Q-factor depends on the laser noise and the noise of the other elements of the system (modulator noise, photodetector noise, electronics noise, oscilloscope noise, etc.).

For the data of FIG. 5a, a Q-factor of 10.3 was measured, which is sufficient for error-free transmission. A bit error rate (BER) of less than $10^{-13}$ was experimentally obtained, which is usually considered as an error-free transmission level. Similar BER and eye diagrams were achieved for other modes within the bandwidth interval of 1264-1266 nm.

Figure 5B:
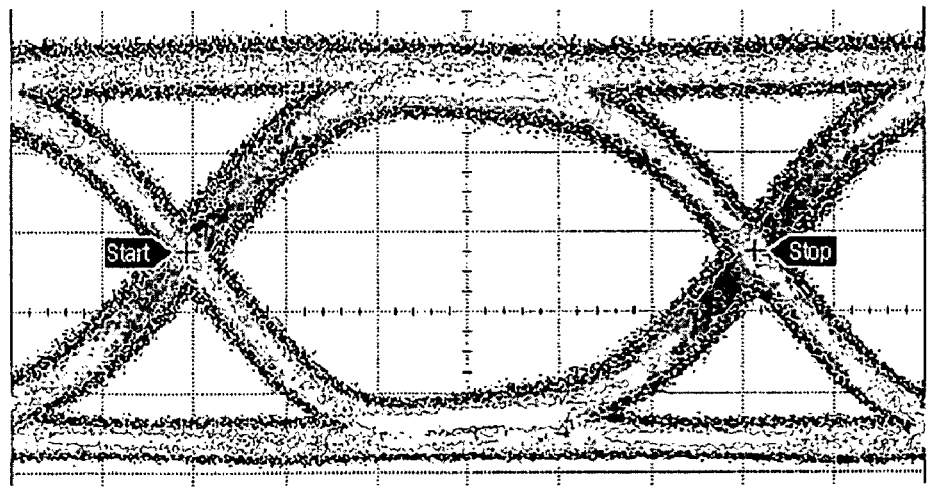
FIG. 5b shows an eye diagram generated by a 10 Gb/s digital modulation of a single-frequency emission of a prior-art laser.

For comparison, a similar experiment was performed using a commercially available prior-art laser. The laser is a 1.3 μm InP-based DBF laser in an external cavity configuration having a single-frequency emission spectrum (i.e. emitting one mode). FIG. 5b shows an eye diagram generated by a 10 Gb/s digital modulation of a single-frequency emission of a prior-art laser. Table 2 shows some of the data obtained from the eye diagram of FIG. 5b. For the data of FIG. 5b, a Q-factor of 11.8 was measured with a similar extinction ratio of approximately 7 dB. Thus, performance of the transmission system only slightly degrades when the single-frequency prior-art laser is substituted with the multi-mode laser of the present invention. Comparison of FIG. 5a and FIG. 5b also reveals that a multi-mode laser of the present invention demonstrates a similar eye diagram at 10 Gb/s modulation as the prior-art single-frequency laser.

TABLE 2

|         | Current  | Minimum  | Maximum  |
|---------|----------|----------|----------|
| Q factor | 11.81   | 11.80    | 11.85    |
| Ext. ratio | 7.40 dB | 7.39 dB | 7.40 dB |
| Bit Rate | 10.0 Gbps | 9.98 Gbps | 10.0 Gbps |

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. An optical transmission system comprising:
   a) a laser comprising an active region, wherein the laser operates on an inhomogeneously broadened optical transition of the active region;
   wherein a spectral bandwidth of an output lasing spectrum of the laser is greater than 5 nm and a spectral power density of the laser is greater than 2 mW/nm such that an optical power of the laser is greater than 10 mW;
   wherein the laser provides a plurality of optical signals at a plurality of different lasing wavelengths;
   b) a transmitter that provides modulation to each lasing wavelength independently; and
   c) a receiver that provides detection to each lasing wavelength independently.

2. The optical transmission system of claim 1, wherein the laser is a semiconductor diode laser.

3. The optical transmission system of claim 2, wherein the laser is a Fabry-Perot semiconductor diode laser further comprising a resonator, wherein the laser operates in a continuous-wave regime and the plurality of optical signals includes a plurality of longitudinal modes of the resonator.

4. The optical transmission system of claim 2 wherein the active region of the laser comprises a plurality of semiconductor quantum dots embedded in a semiconductor matrix having fluctuations in a parameter affecting the optical transition energy, wherein the parameter is selected from the group consisting of:
   a) size;
   b) shape;
   c) chemical composition;
   d) strain;
   e) matrix; and
   f) any combination of a) through e).

5. The optical transmission system of claim 2 wherein the active region of the laser comprises a plurality of two-dimensional quantum wells in a semiconductor matrix having fluctuations in a parameter affecting the optical transition energy, wherein the parameter is selected from the group consisting of:
   a) thickness;
   b) chemical composition;
   c) compositional profile;
   d) strain;
   e) matrix; and
   f) any combination of a) through e).

6. The optical transmission system of claim 1, wherein the laser is a fiber laser and the region comprises a plurality of ions embedded in a fiber core having fluctuations in a parameter affecting the optical transition energy, wherein the parameter is selected from the group consisting of:
   a) chemical composition;
   b) degree of ionization;
   c) distance between neighboring ions; and
   d) any combination of a) through c).

7. The optical transmission system of claim 1, wherein the transmitter comprises at least one waveguide and at least one modulator embedded into a first semiconductor chip and the receiver comprises at least one waveguide and at least one detector embedded into a second semiconductor chip.

8. The optical transmission system of claim 7, wherein the semiconductor chip comprises a material selected from the group consisting of: silicon, gallium arsenide, indium phosphide.

9. The optical transmission system of claim 1, wherein the laser further comprises a bandpass filter that restricts a width of emission spectrum to a desired number of optical channels.

10. The optical transmission system of claim 1, wherein a relative intensity noise of each of the optical signals does not −120 dB/Hz at 0.1 GHz, −130 dB/Hz at 1.0 GHz and −140 dB/Hz at 10 GHz.

11. The optical transmission system of claim 1, further comprising a transmission line to guide the optical signals from the transmitter to the receiver.

* * * * *

UNITED STATES PATENT AND TRADEMARK OFFICE
CERTIFICATE OF CORRECTION

| | | |
|---|---|---|
| PATENT NO. | : 7,835,408 B2 | Page 1 of 1 |
| APPLICATION NO. | : 11/938472 | |
| DATED | : November 16, 2010 | |
| INVENTOR(S) | : Kovsh et al. | |

It is certified that error appears in the above-identified patent and that said Letters Patent is hereby corrected as shown below:

Column 8, lines 60-61: replace "does not" with "does not exceed"

Signed and Sealed this
Twenty-third Day of August, 2011

David J. Kappos
*Director of the United States Patent and Trademark Office*